(12) United States Patent
Kondo et al.

(10) Patent No.: US 8,054,735 B2
(45) Date of Patent: Nov. 8, 2011

(54) OPTICAL DEVICE

(75) Inventors: Hideki Kondo, Yokohama (JP); Naoki Mori, Yokohama (JP)

(73) Assignee: Nichia Corporation, Anan-shi (JP)

( * ) Notice: Subject to any disclaimer, the term of this patent is extended or adjusted under 35 U.S.C. 154(b) by 425 days.

(21) Appl. No.: 12/224,209

(22) PCT Filed: Feb. 19, 2007

(86) PCT No.: PCT/JP2007/052987
§ 371 (c)(1),
(2), (4) Date: Sep. 3, 2008

(87) PCT Pub. No.: WO2007/097290
PCT Pub. Date: Aug. 30, 2007

(65) Prior Publication Data
US 2009/0016201 A1    Jan. 15, 2009

(30) Foreign Application Priority Data

Feb. 22, 2006 (JP) ................................ 2006-045253
Feb. 24, 2006 (JP) ................................ 2006-047740

(51) Int. Cl.
*G11B 7/00* (2006.01)
(52) U.S. Cl. ................ 369/124.14; 369/47.49; 369/121
(58) Field of Classification Search ........................ None
See application file for complete search history.

(56) References Cited

U.S. PATENT DOCUMENTS 5,119,393 A * 6/1992 Oka et al. .................... 372/50.22
5,627,813 A * 5/1997 Miyashita ..................... 369/116
5,757,986 A * 5/1998 Crampton et al. ................. 385/2
5,771,220 A   6/1998 Yuasa et al.
6,091,745 A * 7/2000 Nitta ................................. 372/27
7,145,713 B2 * 12/2006 Chang et al. ................... 359/325
7,187,860 B2 * 3/2007 Bergano et al. .................... 398/9
2002/0149823 A1* 10/2002 Bergano et al. ............... 359/156
2006/0012797 A1* 1/2006 Chang et al. .................. 356/484
2006/0029358 A1* 2/2006 Mahgerefteh et al. .......... 386/33

FOREIGN PATENT DOCUMENTS

| GB | 2 144 912 A | 3/1985 |
| JP | 60-35344 A | 2/1985 |
| JP | 8-139418 A | 5/1996 |
| JP | 9-115166 A | 5/1997 |
| WO | WO-2006/016414 A1 | 2/2006 |
| WO | WO-2007/094247 A1 | 8/2007 |

* cited by examiner

*Primary Examiner* — Joseph Feild
*Assistant Examiner* — Huy Nguyen
(74) *Attorney, Agent, or Firm* — Birch, Stewart, Kolasch & Birch, LLP

(57) ABSTRACT

To provide an optical disc device 1, and similar, equipped with a new mechanism to reduce laser light noise due to optical feedback.

In an optical disc device 1 in which a laser diode is driven by a high frequency modulation method, optical feedback is returned to the laser diode at a timing at which the phase of the injected carrier density is within one of the following ranges: (1) equal to or greater than the peak phase of the injected carrier density of the laser diode, and equal to or less than the peak phase of the injected carrier density of the laser diode plus $3\pi/8$ (radians); or (2) equal to or greater than the peak phase of the injected carrier density of the laser diode plus $9\pi/8$ (radians), and equal to or less than the peak phase of the injected carrier density of the laser diode plus $2\pi$ (radians).

14 Claims, 13 Drawing Sheets

(a)

(b)

OPTICAL DEVICE

TECHNICAL FIELD

This invention relates to an optical device, and in particular relates to an optical disc device, in which a laser diode is driven using a high frequency modulation method as a optical feedback countermeasure, a light emission device using optical fiber, and the like.

BACKGROUND

In optical devices which use laser diodes, a high frequency current is sometimes modulated on the laser diode driving current as a countermeasure for optical feedback; but in the prior art an optical signal processing device has been proposed which modulates a high frequency current so as to traverse across the threshold current of the laser diode, causing multiple longitudinal oscillation modes. In this optical signal processing device, by bringing the frequency of the high frequency modulation signals close to the laser resonance frequency (relaxation oscillation frequency), each of the spectral line widths Δλ of the multimode laser light is increased, and coherence is reduced. By means of such an optical signal processing device, noise arising from optical feedback from an optical system can be reduced, without taking into consideration the optical path lengths of the optical system and laser or the relation to the laser oscillation frequency (Patent Reference 1: Japanese Patent Laid-open No. S60-35344).

DISCLOSURE OF THE INVENTION

However, at present further reduction of noise due to optical feedback is sought. Hence there is a need to develop an optical device equipped with a mechanism other than traversing across the threshold current or bringing the frequency of the high frequency alternating current closer to the laser resonance frequency (relaxation oscillation frequency) to further reduce noise caused by optical feedback.

An object of this invention is to provide an optical device equipped with a new mechanism for reducing laser light noise caused by optical feedback.

By means of this invention, the above problems can be resolved as follows.

In an optical device of this invention, in which a laser diode is driven by a high frequency modulation method, optical feedback is returned to the laser diode at a timing at which the phase of the injected carrier density is within one of the following ranges: (1) equal to or greater than the peak phase of the injected carrier density of the laser diode, and equal to or less than the peak phase of the injected carrier density of the laser diode plus 3π/8 (radians); or (2) equal to or greater than the peak phase of the injected carrier density of the laser diode plus 9π/8 (radians), and equal to or less than the peak phase of the injected carrier density of the laser diode plus 2π (radians).

By means of this invention, an optical device can be provided which is equipped with a new mechanism for reducing noise due to optical feedback.

Figure 1:
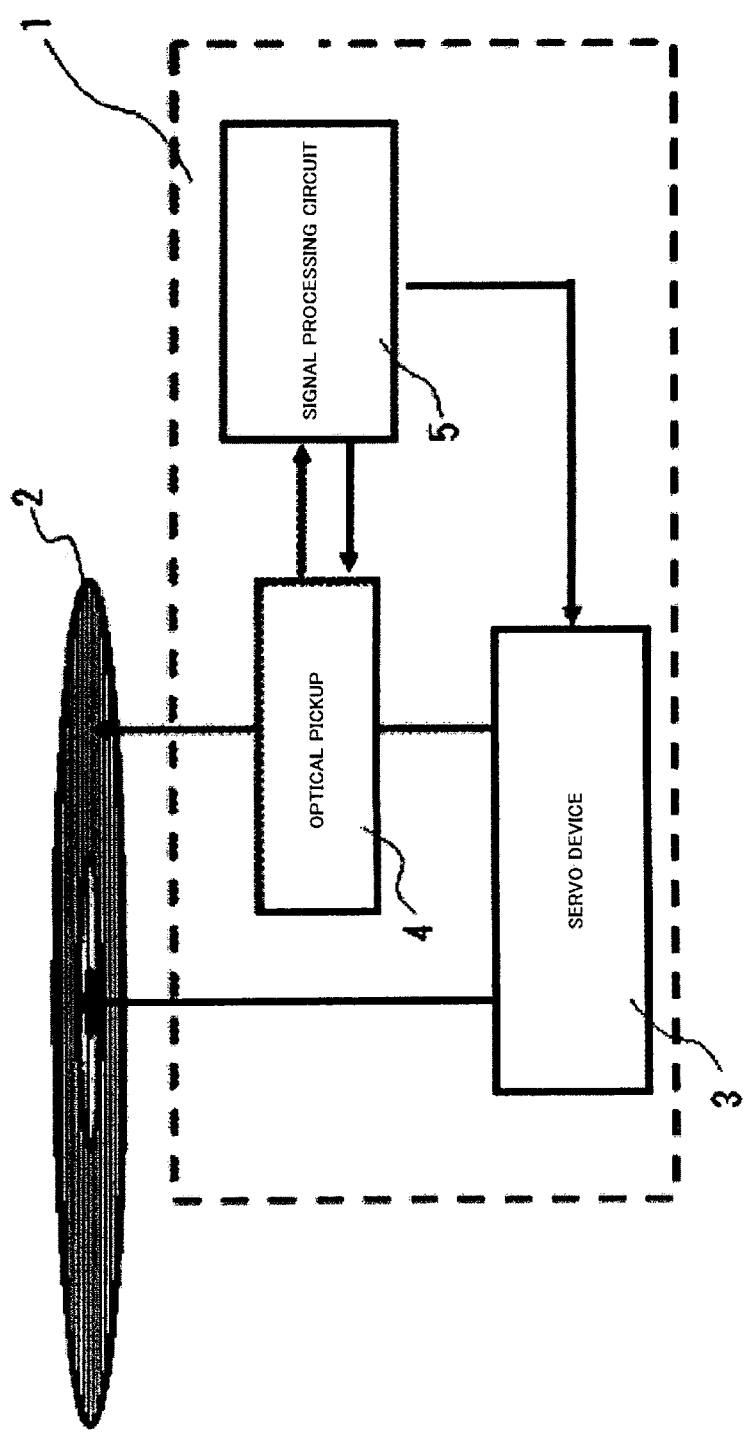
FIG. 1 shows the optical disc device 1 of an aspect of the invention.

1 Optical disc device
2 Optical disc
3 Servo device
4 Optical pickup
5 Signal processing circuit

BEST MODE FOR CARRYING OUT THE INVENTION

An optical device of this invention, in which a laser diode is driven using a high frequency modulation method, is characterized in that optical feedback is returned to the laser diode at a timing at which the phase of the injected carrier density is within one of the following ranges: (1) equal to or greater than the peak phase of the injected carrier density of the laser diode, and equal to or less than the peak phase of the injected carrier density of the laser diode plus 3π/8 (radians); or (2) equal to or greater than the peak phase of the injected carrier density of the laser diode plus 9π/8 (radians), and equal to or less than the peak phase of the injected carrier density of the laser diode plus 2π (radians).

It is preferable that the optical path length and the frequency of the high frequency modulation satisfy the following relationship.

$$\sum_i (L_i \times N_i) = 1/2 \times \alpha/16 \times C \times 1/f \quad [\text{E1}]$$

$$5 + 16n \leq \alpha \leq 15 + 16n, n \geq 0$$

where $L_i$ is the optical path length of the interval, $N_i$ is the refractive index of the interval, C is the speed of light, f is the modulated frequency, and $\Sigma_i L_i$ is the optical path length (one way).

In an optical device, by fixing the optical path length and adjusting the frequency of the high frequency modulation, the optical feedback can be returned to the laser diode at the above timing.

In an optical device, by fixing the frequency of the high frequency modulation and adjusting the optical path length, the optical feedback can be returned to the laser diode at the above timing.

In an optical device, by simultaneously adjusting the frequency of the high frequency modulation and the optical path length, the optical feedback can be returned to the laser diode at the above timing.

In an optical device, by adjusting, in alternation, the frequency of the high frequency modulation and the optical path length, the optical feedback can be returned to the laser diode at the above timing.

In the high frequency modulation method of an optical device, the high frequency current does not traverse across the laser diode threshold current. Here, for the laser diode not to traverse across the threshold current means that the laser diode optical output is larger than "0".

In an optical device, the laser diode is driven by the high frequency modulation method, and the high frequency current does not traverse across the laser diode threshold current. Here, for the laser diode not to traverse across the threshold current means that the laser diode optical output is larger than "0".

In the high frequency modulation method of an optical device, the frequency of the high frequency modulation is in the relaxation oscillation range.

In an optical device, the high frequency current is spread spectrum.

Below, optimum aspects for implementing the invention are explained in detail, referring to the attached drawings. In the following, one aspect for a case of application of the invention to an optical disc device is explained; but of course the invention is not limited to optical disc devices.

FIG. 1 shows the optical disc device 1 of an aspect of the invention.

The optical disc device 1 of the aspect of the invention comprises at least an optical pickup 4, servo device 3 which drives the optical disc 2 and optical pickup 4, and signal processing circuit 5 which processes output signals of the optical pickup 4.

In this optical disc device 1, laser light emitted from a laser diode (not shown) comprised by the optical pickup 4 is reflected by the optical disc 2, and returns to the laser diode as optical feedback. In order to reduce the noise caused by this optical feedback, in the optical disc 1 of this aspect, the laser diode is driven by the high frequency modulation method.

Figure 2A:
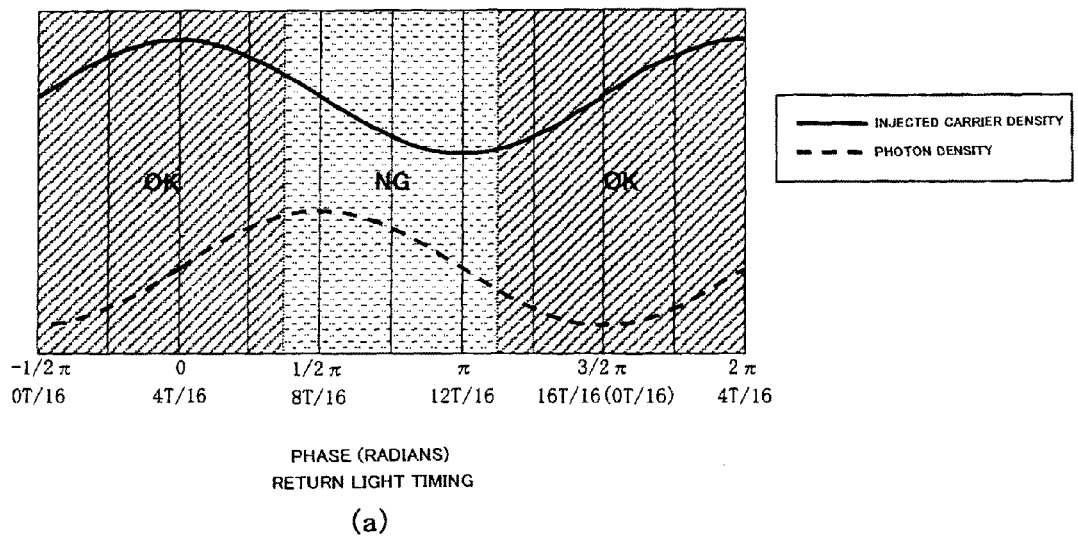
FIG. 2 shows conceptually, in (a), the relation between laser diode injected carrier density and photon density (light output), and in (b), the relation between these and optical feedback.
Figure 2B:
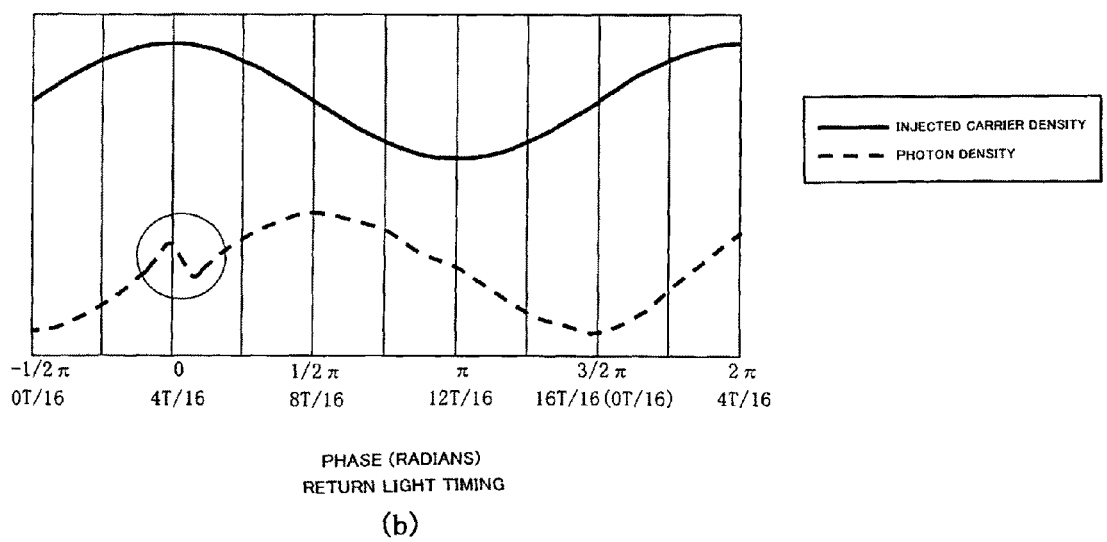

In (a) of FIG. 2, an example is shown of the relation between the laser diode injected carrier density and the photo density (optical output), for a case in which the laser diode resonance frequency fr is used as the high frequency modulation. In this invention, "phases" (in radians) are always the phases of injected carrier densities.

The peak phase of the injected carrier density, which is the phase at which the laser diode injected carrier density is maximum, leads the photon density peak of the laser diode by $\pi/2$ (radians). That is, the photon density peak appears lagging $\pi/2$ (radians) behind the peak phase of the injected carrier density.

In the optical disc device of this aspect, optical feedback is returned to the laser diode at a timing at which the injected carrier density phase is within one of the following ranges:

(1) equal to or greater than the peak phase of the injected carrier density of the laser diode, and equal to or less than the peak phase of the injected carrier density of the laser diode plus $3\pi/8$ (radians); or, (2) equal to or greater than the peak phase of the injected carrier density of the laser diode plus $9\pi/8$ (radians), and equal to or less than the peak phase of the injected carrier density of the laser diode plus $2\pi$ (radians).

That is, explaining for a case in which the high frequency modulation is the resonance frequency fr of the laser diode, optical feedback is returned to the laser diode with timing such that the injected carrier density phase is as indicated by "OK" in the waveform of (a) in FIG. 2, and is not returned with timing indicated by "NG".

In order to return the optical feedback to the laser diode with the above timing, the optical path length and the frequency of high frequency modulation should satisfy the following relationship.

$$\sum_i (L_i \times N_i) = 1/2 \times \alpha/16 \times C \times 1/f \qquad [E2]$$

$$5 + 16n \leq \alpha \leq 15 + 16n, n \geq 0$$

where $L_i$ is the optical path length of the interval, $N_i$ is the refractive index of the interval, C is the speed of light, f is the modulated frequency, and $\Sigma_i L_i$ is the optical path length (one way).

Here, in the case of an optical disc device, $L_i$ and $N_i$ are for example the optical path length and refractive index for each of the intervals from the laser diode to the optical disc.

Figure 3:
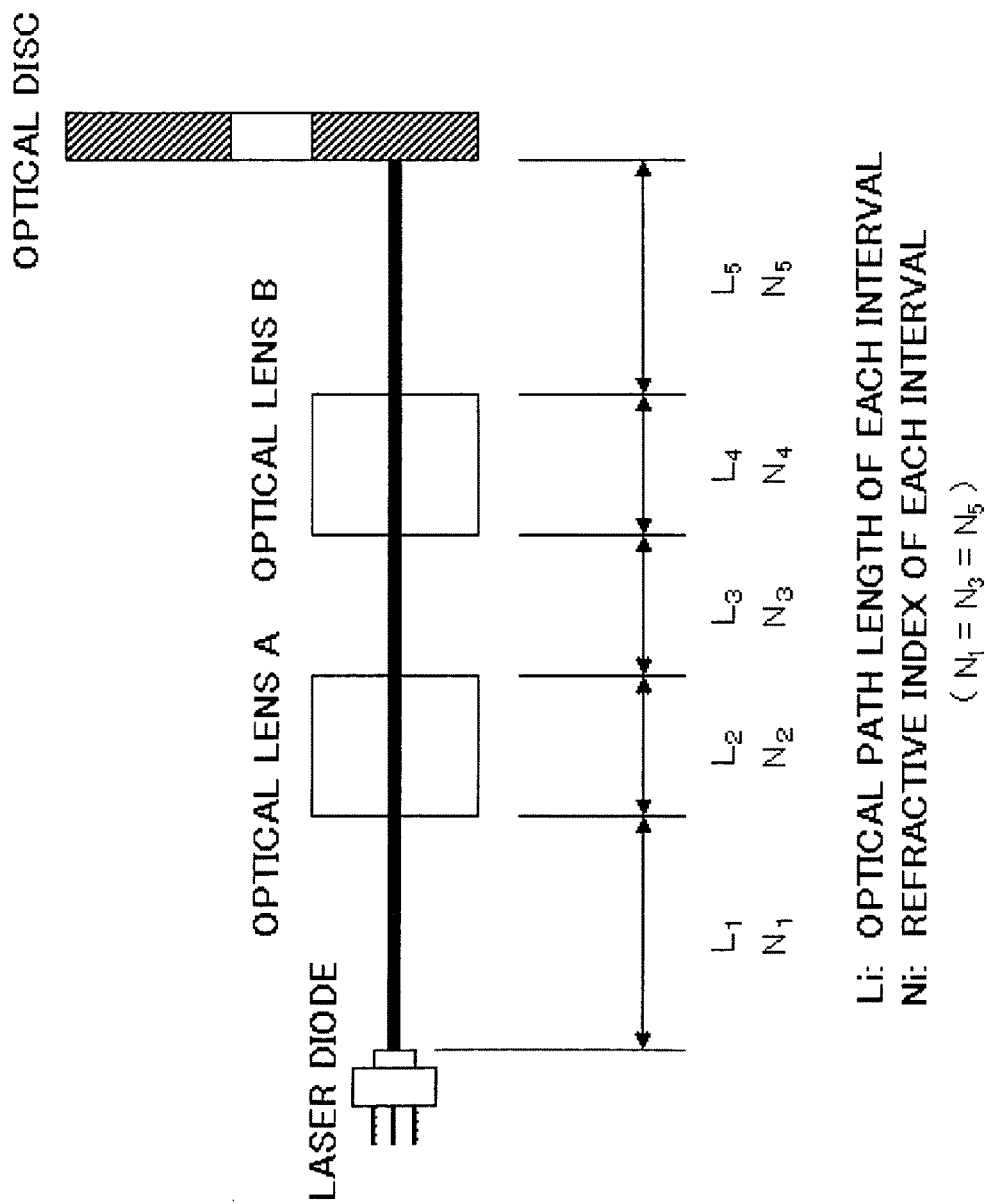
FIG. 3 shows an example of an optical system used to explain optical path length and refractive index.

For example, an optical system such as that shown in FIG. 3 can be used. The optical path length and refractive index from the laser diode to the optical lens A are $L_1$ and $N_i$; the optical path length and refractive index in the optical lens A are $L_2$ and $N_2$; the optical path length and refractive index from optical lens A to optical lens B are $L_3$ and $N_3$; the optical path length and refractive index within the optical lens B are $L_4$ and $N_4$; and the optical path length and refractive index from the optical lens B to the optical disc are $L_5$ and $N_5$ (however, if the space between the laser diode and the optical lens A, the space between the optical lens A and the optical lens B, and the space between the optical lens B and the optical disc are filled with air, then $N_1=N_3=N_5$). Summation as denoted by $\Sigma$ is performed for one-way segments of optical path lengths (the optical path lengths for each interval from the laser diode to the optical disc), so that for example, in this optical system, the result is $L_1N_1+L_2N_2+L_3N_3+L_4N_4+L_5N_5$.

Based on the above equation, if the optical path length and high frequency modulation are adjusted, then optical feedback can be returned to the laser diode with the above timing, development and manufacture of optical devices can be simplified, and optical devices can be made more stable and less expensive. In order that the optical path length and frequency of high frequency modulation satisfy the above equation, for example, the optical path length may be fixed and the frequency of high frequency modulation may be adjusted, or the frequency of high frequency modulation may be fixed and the optical path length adjusted, or the frequency of high frequency modulation and the optical path length may be adjusted simultaneously, or the frequency of high frequency modulation and the optical path length may be adjusted in alternation. If the optical path length is fixed and the frequency of high frequency modulation is adjusted, then even when there are constraints on the positioning of the optical system, the timing with which optical feedback is returned to the laser diode can be adjusted. If the frequency of high frequency modulation is fixed and the optical path length is adjusted, then even when the range of variation of the frequency of the high frequency modulation unit is limited, the timing with which optical feedback is returned to the laser diode can be adjusted. And, if the frequency of high frequency modulation and optical path length are adjusted simultaneously, or if the frequency of high frequency modulation and optical path length are adjusted in alternation, then the time for adjustment of the timing with which optical feedback is returned to the laser diode can be shortened.

Further, when as shown in FIG. 2 a peak in the optical waveform caused by optical feedback (the area enclosed in a circle in (b) of FIG. 2) can be confirmed using an optical oscilloscope, the timing with which optical feedback is returned to the laser diode can also be adjusted such that this peak in the optical waveform due to optical feedback occurs within the "OK" timing shown in (a) of FIG. 2. By this means, the above timing can be confirmed visually using an optical oscilloscope, and optical device development, manufacture, and other tasks become easier.

Further, even in cases in which optical feedback cannot be confirmed using an optical oscilloscope, the fact that the phase of the injected carrier density is the injected carrier density peak phase plus $3\pi/2$ (radians) at the timing in the vicinity in which the laser diode photon density is minimum, regardless of the frequency of high frequency modulation, may be utilized. That is, taking as reference the timing in the vicinity the laser diode photon density is minimum, the change amount in the phase of the injected carrier density is calculated, and by adding to this calculated amount of change in the phase the injected carrier density peak phase plus $3\pi/2$ (radians), the timing for return of optical feedback to the laser diode can be adjusted. In this way, optical feedback which cannot be viewed on an optical oscilloscope becomes viewable, and optical device development and manufacture become easier. In cases in which optical feedback cannot be confirmed with timing in the vicinity in which the laser diode photon density is minimum, the laser diode power may be held constant while increasing the direct current component in high frequency modulation, and moreover reducing the amplitude of the high frequency current.

These means represent one of several examples and do not limit the means for adjusting the return to the laser diode of optical feedback in this invention.

Below, the reasons for returning the optical feedback to the laser diode with the timing described above in an optical disc device of this aspect are explained.

In an optical disc device of the prior art, the high frequency current is modulated on the laser diode so as to traverse across the threshold current, so that optical feedback is returned to the diode at a timing at which the laser diode photon density is minimum (generally "0").

However, in this aspect, rather than returning optical feedback to the laser diode at timing at which the laser diode photon density is minimum (generally "0"), optical feedback is returned with the new timing for optical feedback described below.

The refractive index in the laser diode is decreased due to plasma effects when the injected carrier density is high, and is increased due to plasma effects when the injected carrier density is low. Hence in the laser diode, under resonance conditions ($m*\lambda o/N_{eff}=2L_{1d}$, where m is an integer greater than or equal to 1, $\lambda o$ is the wavelength in vacuum, $N_{eff}$ is the effective refractive index of the laser diode, and $L_{1d}$ is the resonator length of the laser diode), whereas when the injected carrier density is high the wavelength of the oscillation light is shorter, when the injected carrier density is low the wavelength of oscillation light is longer. Taking this so-called chirping phenomenon into account, in the laser diode the injected carrier density is high when the light intensity is rising, so that the wavelength of oscillation light is shortened, and the injected carrier density is low when falling, so that the wavelength of oscillation light is lengthened.

In consideration of this point, upon studying the timing for returning optical feedback to the laser diode, if optical feedback is returned to the laser diode at a timing at which the injected carrier density phase is in the vicinity of the laser diode injected carrier density peak phase plus $\pi/2$ (radians), then the wavelength of oscillation light of the laser diode substantially coincides with the wavelength of optical feedback, and light interference occurs, despite the occurrence of chirping, so that noise increases. And, if optical feedback is returned to the laser diode at a timing at which the injected carrier density phase is in the vicinity of the laser diode injected carrier density peak phase plus $\pi$ (radians), then the injected carrier density becomes a minimum, so that gain is reduced, and although induced emission due to optical feedback is suppressed, absorption occurs, and noise increases. Further, if optical feedback is returned to the laser diode in the vicinity of timing such that the injected carrier density phase is equal to or greater than the laser diode injected carrier density peak phase plus $\pi/2$ (radians), and equal to or less than the laser diode injected carrier density peak phase plus $\pi$ (radians) (in (a) of FIG. 2, the range indicated by "NG"), then noise increases due to the influence of the above-described light interference, or absorption, or both.

Hence in this aspect, optical feedback was returned to the laser diode at a timing at which the injected carrier density is within one of the following ranges:

(1) equal to or greater than the peak phase of the injected carrier density of the laser diode, and equal to or less than the peak phase of the injected carrier density of the laser diode plus $3\pi/8$ (radians); or, (2) equal to or greater than the peak phase of the injected carrier density of the laser diode plus $9\pi/8$ (radians), and equal to or less than the peak phase of the injected carrier density of the laser diode plus $2\pi$ (radians);

and, increases in noise due to the above-described light interference and absorption were reduced.

In an optical disc device of this aspect, if the frequency of laser diode high frequency modulation is in the relaxation oscillation range, then noise can be further reduced. This is thought to be because when the frequency of high frequency modulation is in the relaxation oscillation range, the above-described chirping appears more prominently. In this Specification, "relaxation oscillation range" means the frequency range equal to or greater than fr/2 and equal to or less than 2 fr, where fr is the resonance frequency of the laser diode when there is no influence due to optical feedback.

In an optical disc device of this aspect, the high frequency current can be made to traverse across the laser diode threshold current, or can be made not to traverse across. Here, for the laser diode not to traverse across the threshold current means that the laser diode optical output is larger than "0". In devices of the prior art, on/off control of the laser diode (traversing across of the threshold current) was taken to be a necessary condition (see Patent Reference 1); but when taking into the account the timing for return of optical feedback to the laser diode as in this aspect, countermeasures for the above optical interference and absorption have been taken, so that noise can be reduced even when traversing across the laser diode threshold current by the high frequency current is not a necessary condition.

Figure 4:
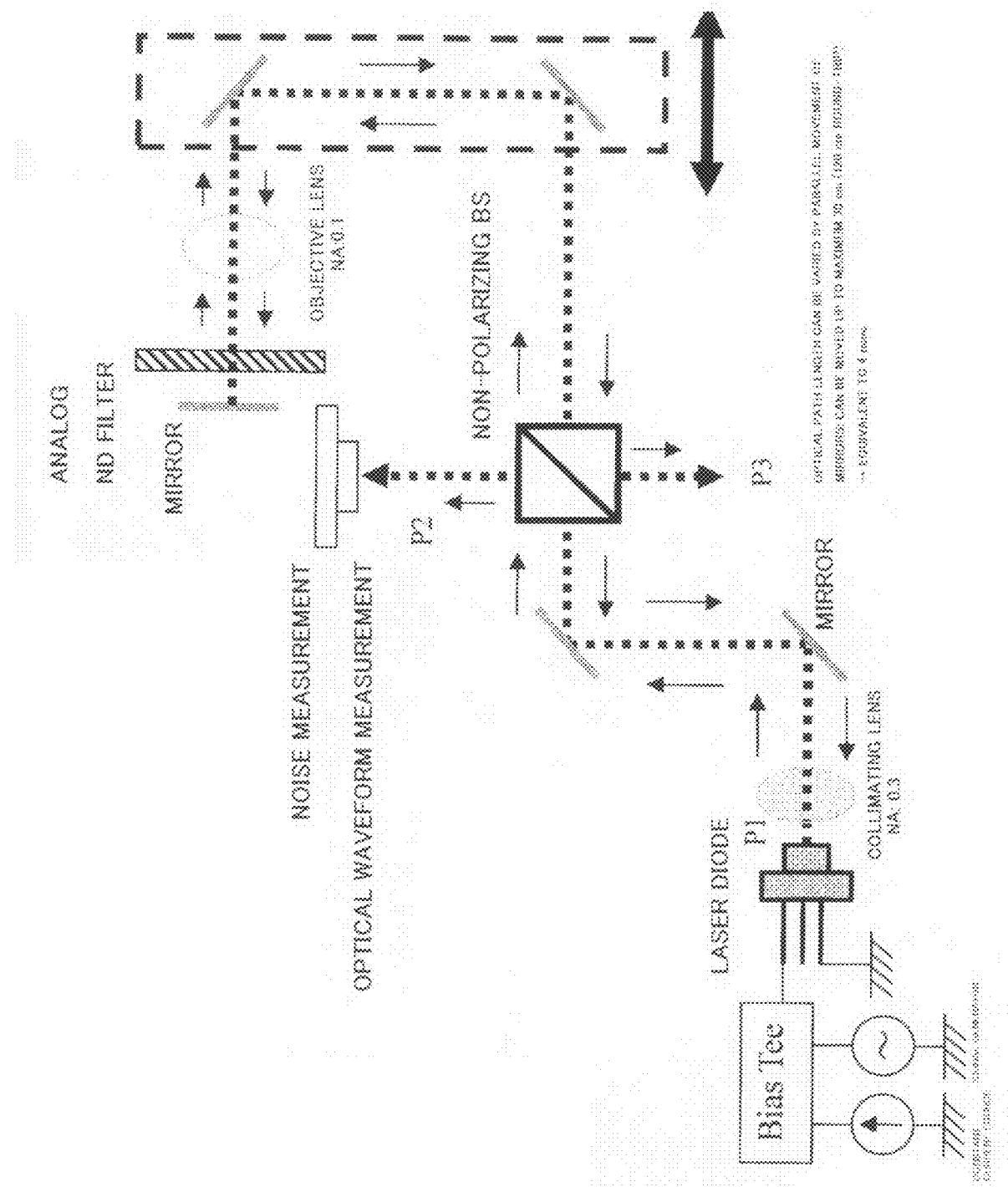
FIG. 4 shows an evaluation system.

FIG. 4 shows an evaluation system.

In this evaluation system, a collimating lens with NA=0.3 is used to form a parallel beam from the laser diode, and then two mirrors are used to adjust the optical axis. In this system, the two mirrors, surrounded by dashed lines, can be moved in parallel by a stepping motor to vary the optical path length, and finally light condensed by an objective lens is reflected by a mirror and returned to the laser diode. By monitoring the light P2 in the figure, laser light noise or the optical waveform can be measured. By monitoring the light P3 in the figure, the beam splitter division ratio can be used to calculate the amount of light returned to in front of the collimating lens. Also, an ND filter is adjusted such that the optical feedback ratio is approximately 0.3%.

With respect to the optical path length, the length of one modulated period, calculated from the modulating frequency and the speed of light, is divided by 16, and the RIN (Relative Intensity Noise) is measured within each optical path length segment; the reference timing (OT/16) was taken to be at the position at which induced emission light, caused by optical feedback, is observed in the center of the optical waveform. The optical path length and phase have the following relationship.

$$nT/16=\pi*(n-4)/8n \geq 0 \quad [E3]$$

Through the above settings, optical feedback noise can be evaluated while varying the optical path length, and moreover the optical waveform at this time can be observed.

Also, the laser diode output was fixed at 5 mW, and modulating was performed so that the high frequency current did not traverse across the threshold current.

Figure 5:
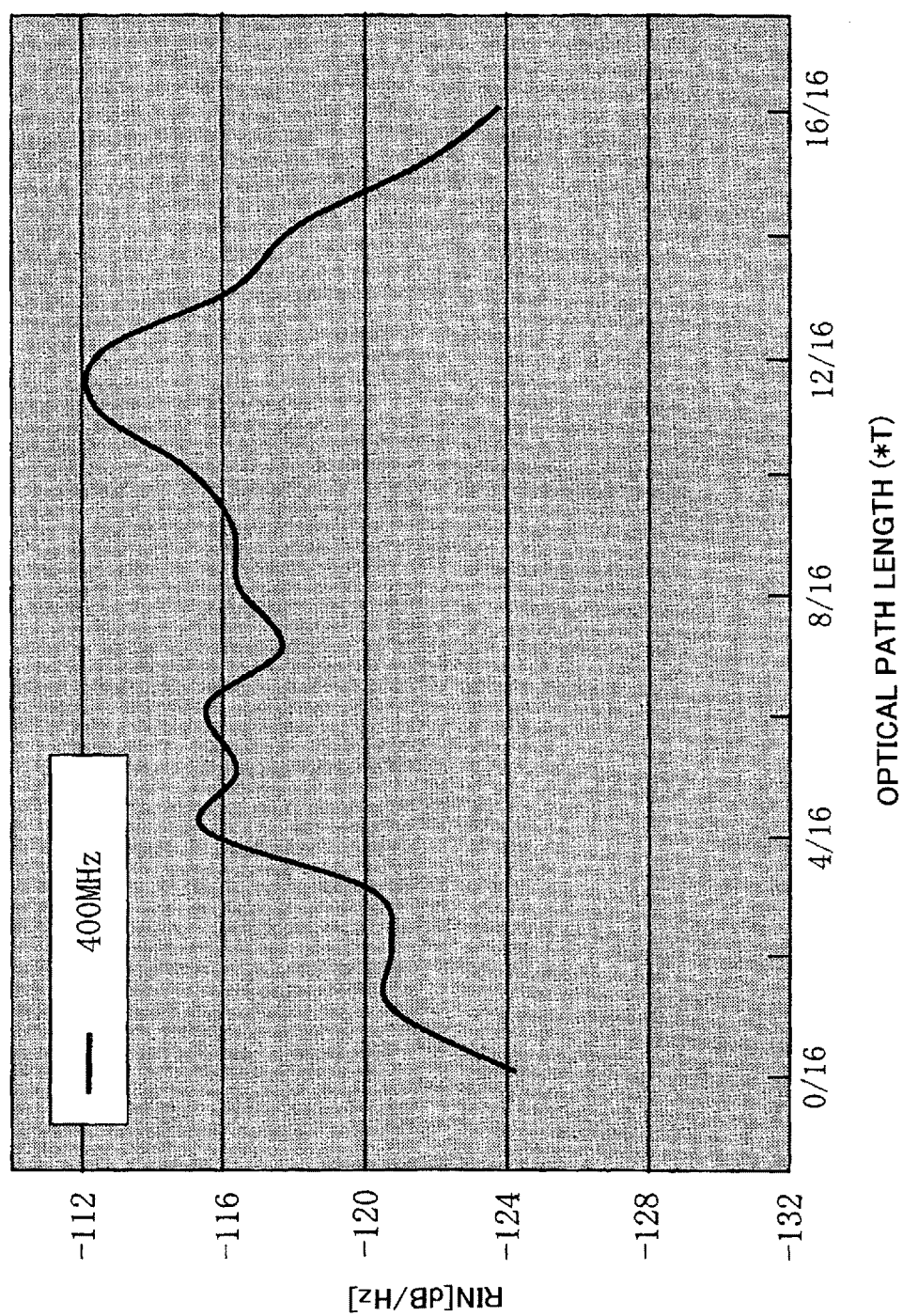
FIG. 5 shows an example of experimental results using the evaluation system (modulated frequency 400 MHz, modulated such that the high frequency current does not traverse across the threshold current)
Figure 6:
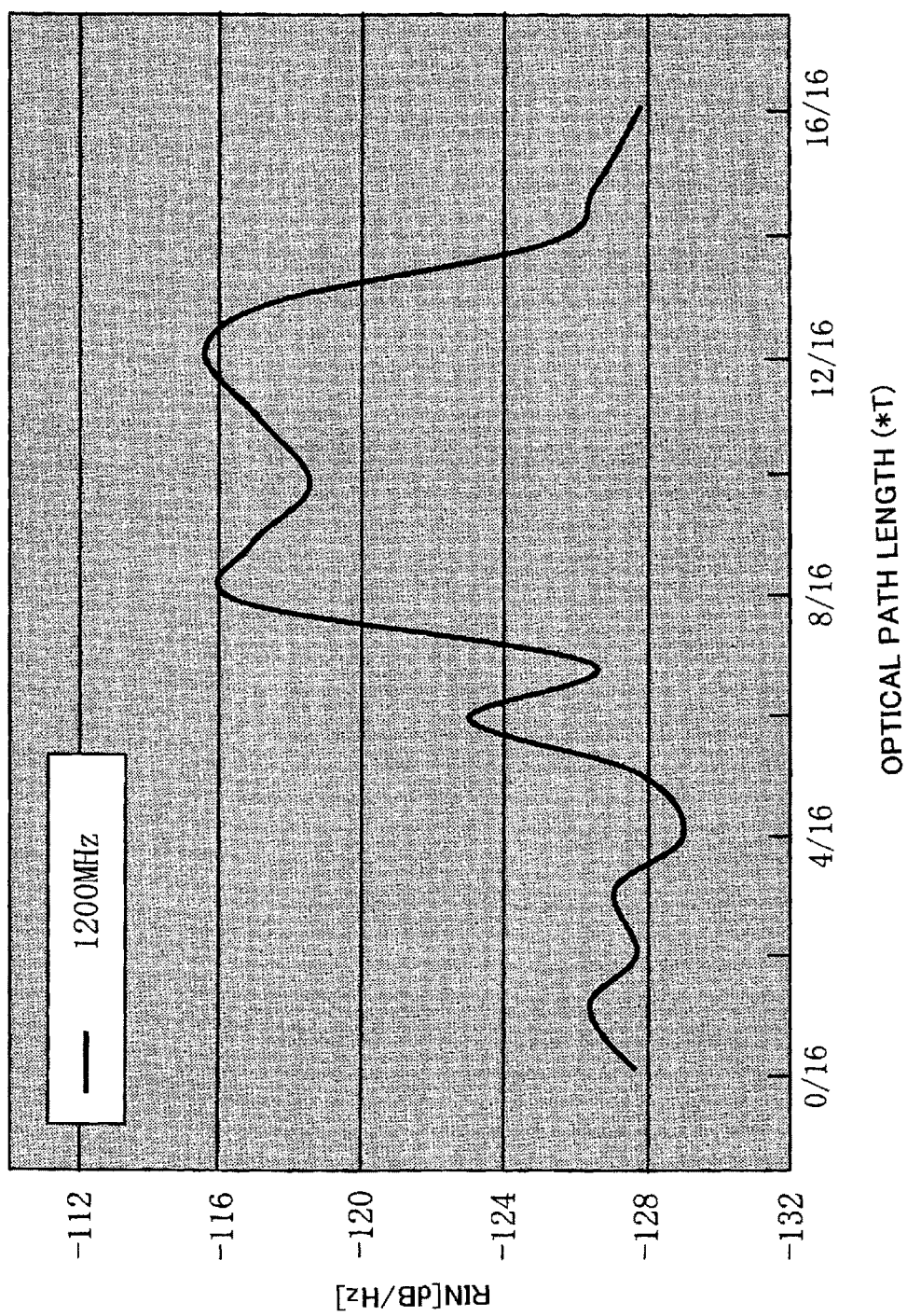
FIG. 6 shows an example of experimental results using the evaluation system (modulated frequency 1200 MHz, modulated such that the high frequency current does not traverse across the threshold current)
Figure 7:
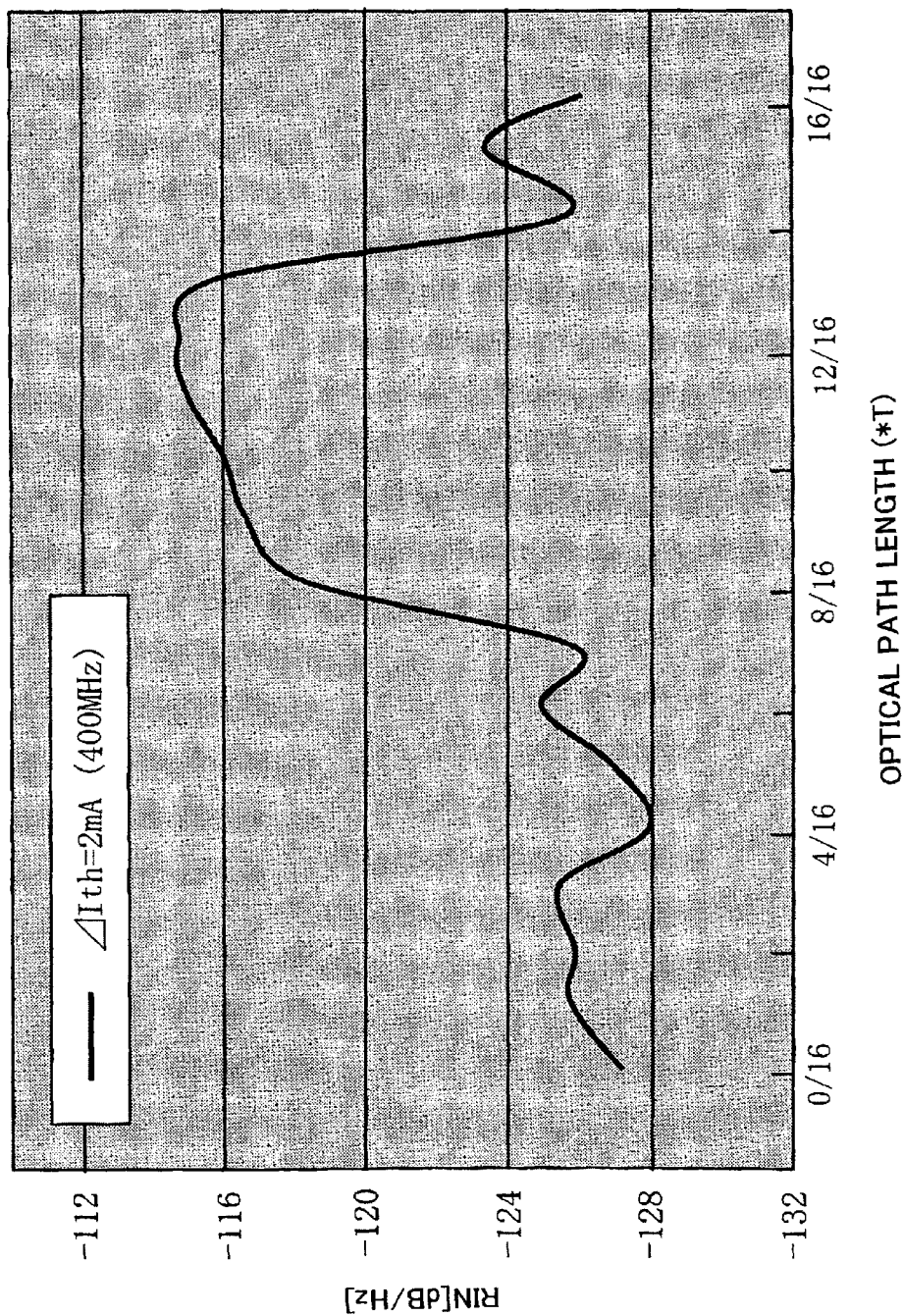
FIG. 7 shows an example of experimental results using the evaluation system (modulated frequency 400 MHz, ΔIth=2 mA)

FIG. 5 to FIG. 7 shows an example of experimental results using the above evaluation system.

In FIG. 5, the modulating frequency was set to 400 MHz, and in FIG. 6 the modulating frequency was set to 1200 MHz. In both FIG. 5 and FIG. 6 modulating was performed so that the high frequency current did not traverse across the threshold current. On the other hand, in FIG. 7 the modulating frequency was set to 400 MHz with $\Delta$Ith=2 mA, which are the general conditions for optical storage.

As shown in FIG. 5 to FIG. 7, the RIN value differs greatly with the modulating frequency and optical path length. Also, upon comparing FIG. 6 and FIG. 7 it was found that substantially the same values were obtained (see FIG. 7).

Figure 8:
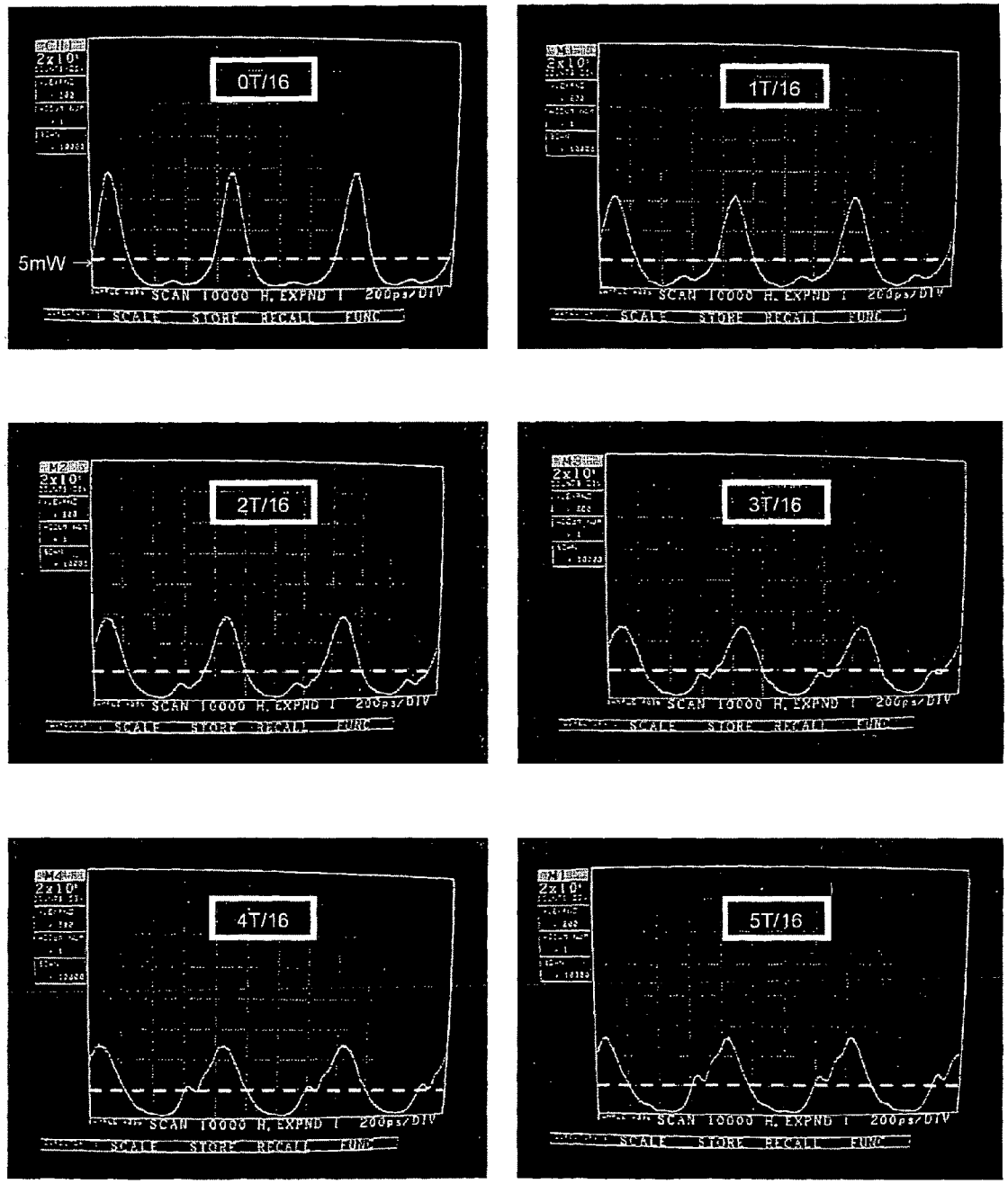
FIG. 8 is a (first) diagram showing the optical waveform observed using the evaluation system, when the modulated frequency is 1200 MHz (X: 200 psec/div, Y: 5 mW/div)
Figure 9:
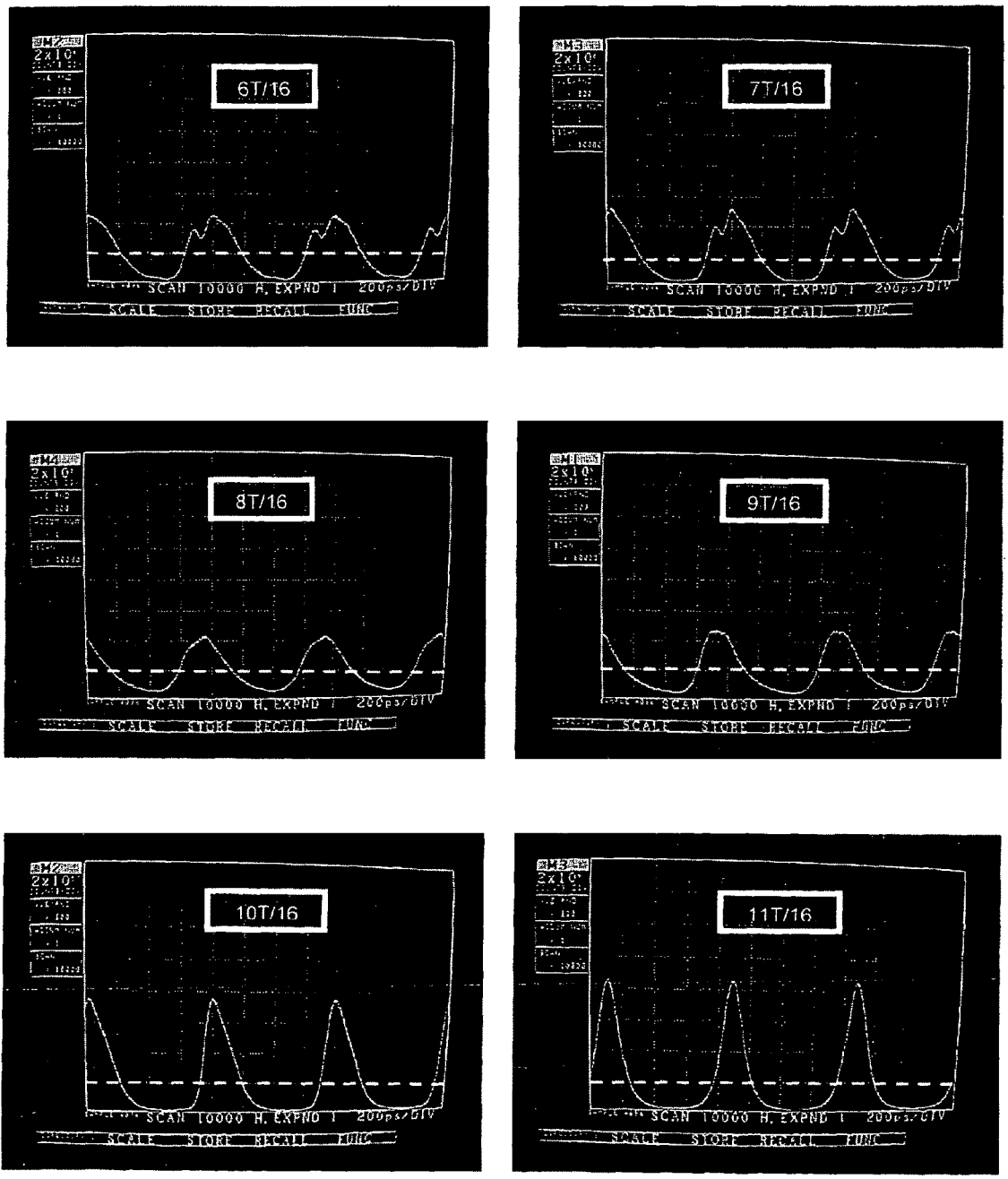
FIG. 9 is a (second) diagram showing the optical waveform observed using the evaluation system, when the modulated frequency is 1200 MHz (X: 200 psec/div, Y: 5 mW/div)
Figure 10:
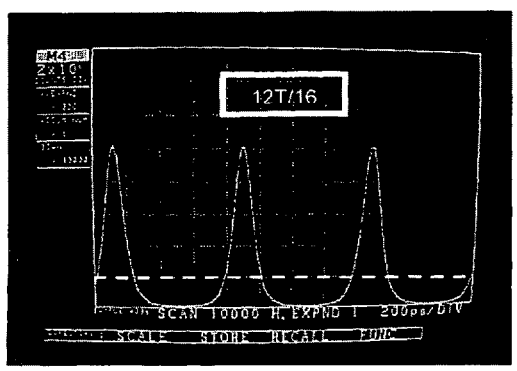
FIG. 10 is a (third) diagram showing the optical waveform observed using the evaluation system, when the modulated frequency is 1200 MHz (X: 200 psec/div, Y: 5 mW/div)
Figure 10:
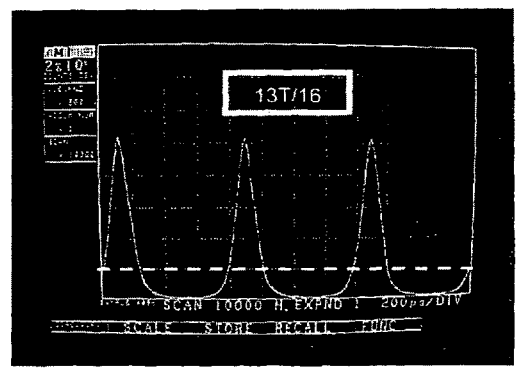
Figure 10:
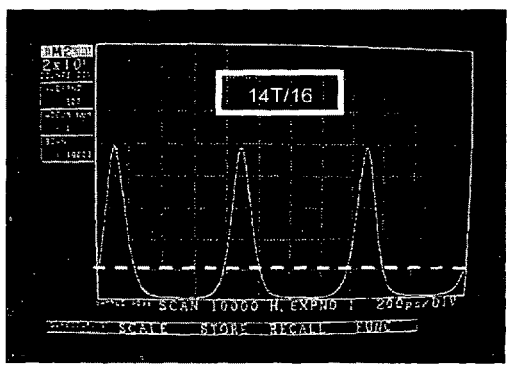
Figure 10:
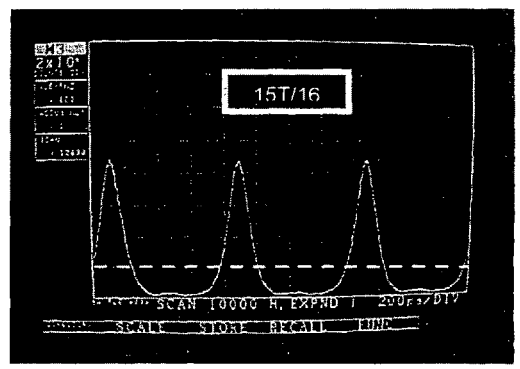
Figure 10:
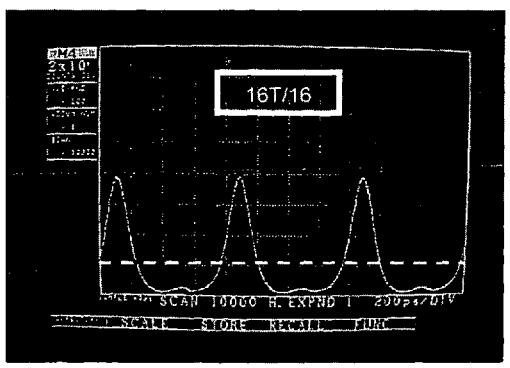

FIG. 8 to FIG. 10 show waveforms observed by the above evaluation system, for a case in which the modulating frequency is 1200 MHz (X: 200 psec/div, Y: 5 mW/div).

As shown in FIG. 8 to FIG. 10, it can be confirmed that in optical waveforms, small waveform peaks (optical waveform peaks due to optical feedback) rise from a base toward the crest at optical path lengths from 0 T/16 to 8 T/16. This is due to induced emission caused by the influence of optical feedback. On the other hand, at optical path lengths of 8 T/16 and beyond almost no small waveform peaks can be observed.

Figure 11:
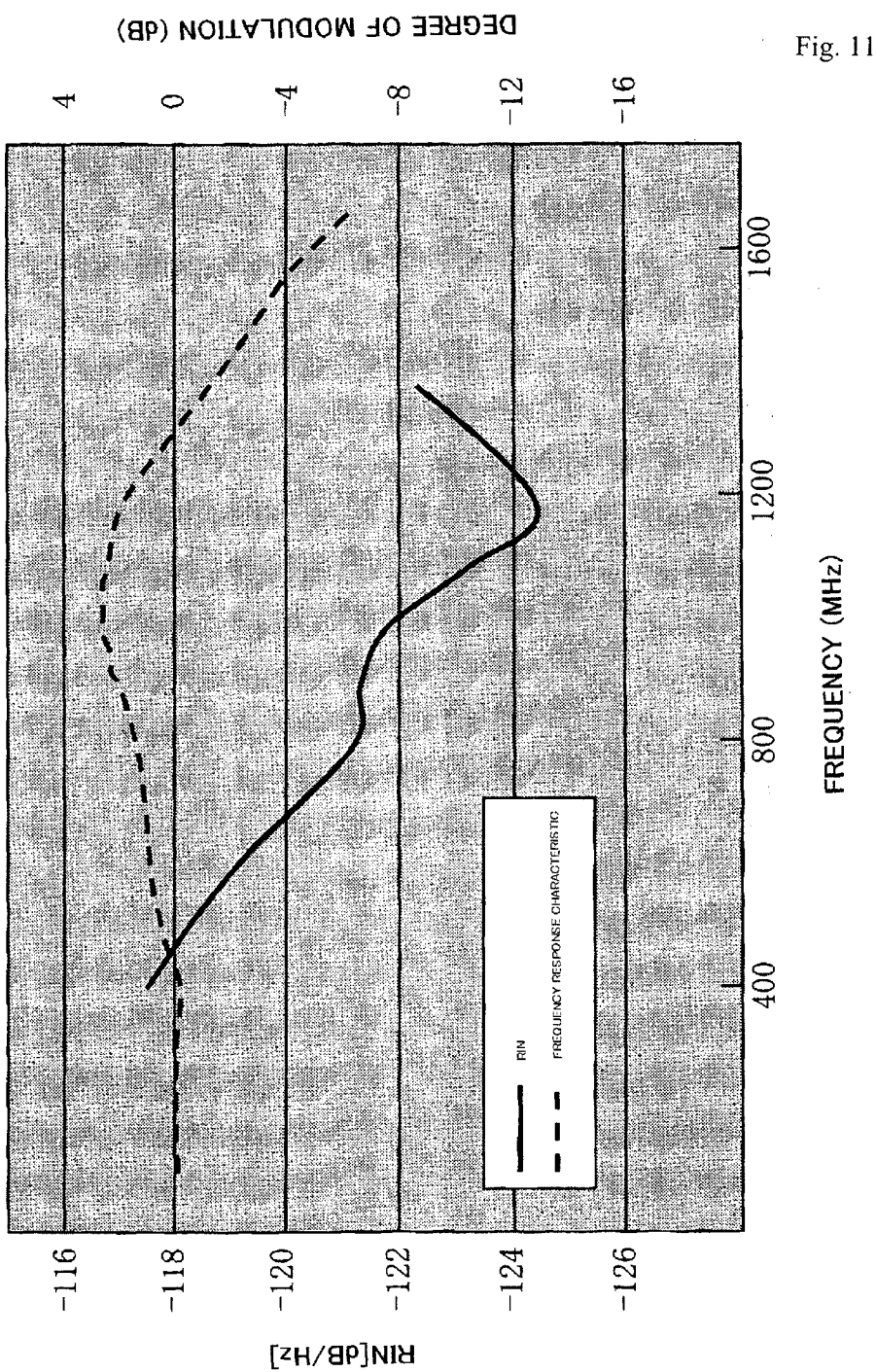
FIG. 11 shows the relation between RIN and frequency response characteristic.

FIG. 11 shows the relation between RIN and frequency response characteristics.

Here, RIN is the average value for each optical path length at each modulating frequency. Also, frequency response characteristics are the frequency response characteristics for the laser diode when there is no influence from optical feedback; when the resonance frequency of the frequency response characteristic is fr, then the frequency range from fr/2 and above to 2fr and below is the relaxation oscillation range. As is seen from the figure, satisfactory RIN characteristics are seen in the relaxation oscillation range. The high frequency current is modulated so as not to traverse across the threshold current.

Figure 12:
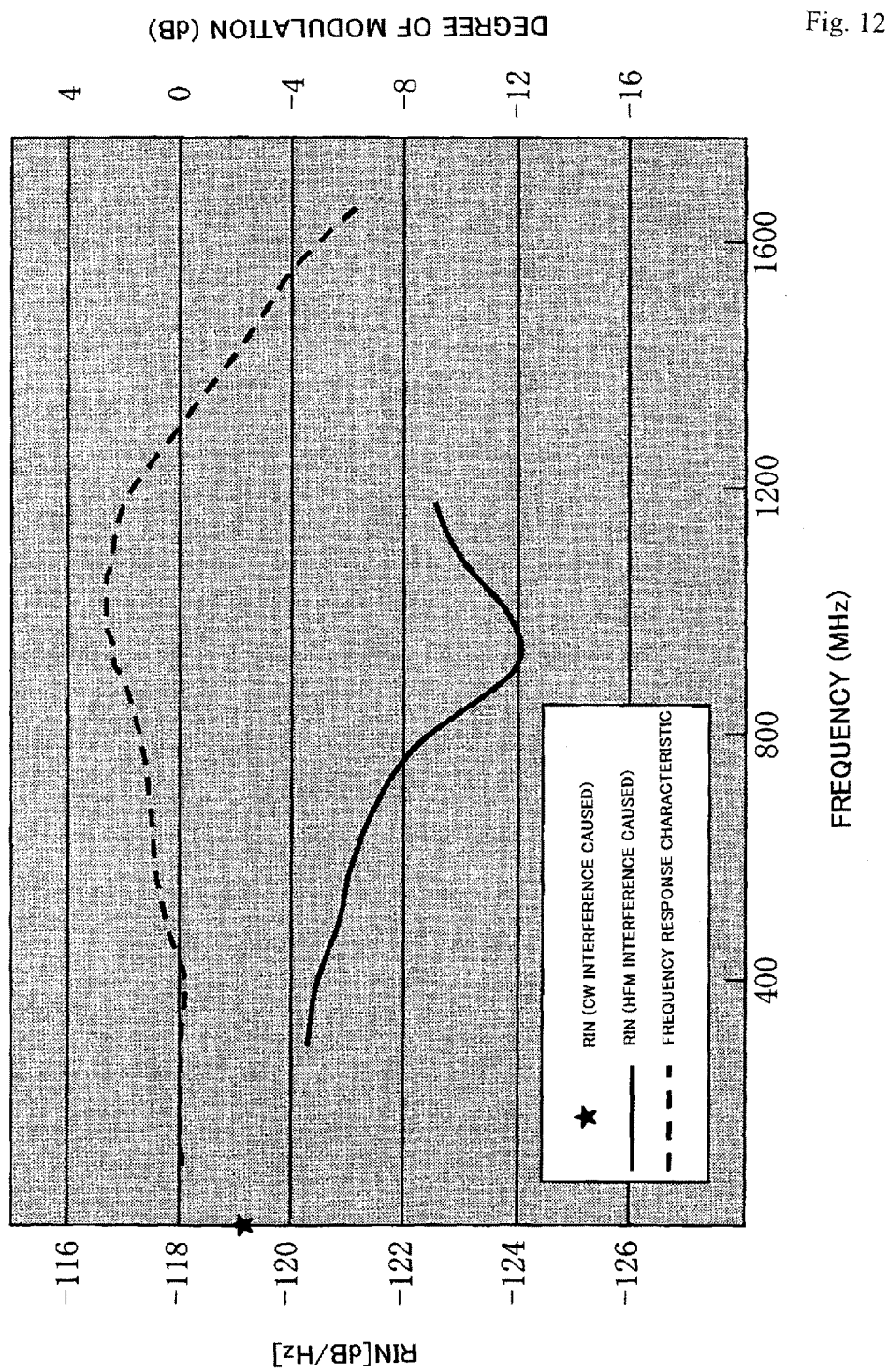
FIG. 12 shows RIN evaluation results using parallel-plate glass sheets.

FIG. 12 shows RIN evaluation results using parallel-plate glass members.

In order to determine the extent to which high frequency modulation which does not traverse across the threshold current weakens the laser coherence, and the extent of the effect on RIN, parallel-plate glass members were used to cause interference, and the relation between the modulating frequency and the laser noise (RIN) was studied.

In the evaluation system, the laser diode was made to emit at 5 mW, an NA=0.3 collimating lens was used to form a parallel beam, the parallel-plate glass members were irradiated, causing interference, and the RIN of the transmitted light was measured. Here also, modulating was performed to the extent that the high frequency current did not traverse across the threshold current.

When compared with CW under interference conditions, the RIN rises when high frequency modulation not traversing across the threshold current is applied, and it is seen that the effect is especially pronounced in the relaxation oscillation range. Also, although not shown, in evaluations of coherence characteristics also it is seen that coherence is weakened in the relaxation oscillation range. Hence even when the threshold current is not traversed across, in the relaxation oscillation range, the RIN declines.

Whereas in FIG. 11 there is a deviation between the frequency response characteristic and the RIN minimum value, in FIG. 12 there is substantial coincidence. This is thought to be because the RIN shown in FIG. 11 was measured under conditions in which optical feedback was present, whereas the RIN shown in FIG. 12 was measured under conditions with no optical feedback present. The frequency response characteristics are thought to change depending on whether optical feedback is present.

Figure 13:
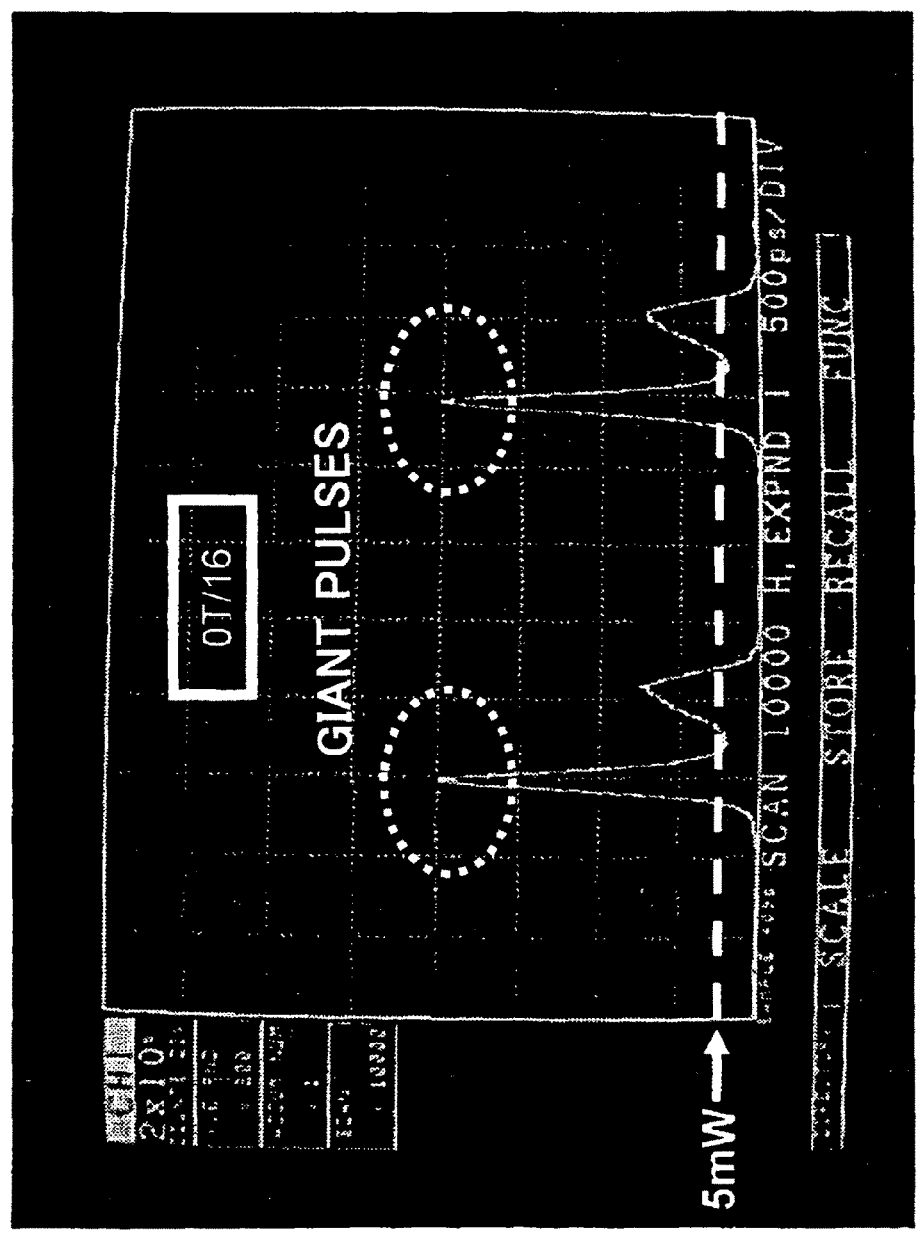
FIG. 13 shows an example of a giant pulse.

During data reading by an optical disc playback device, application of high frequency modulation is generally used as a method to reduce mode-hopping noise and the effects of optical feedback on the laser diode due to reflected light from the optical disc. In essence, modulating is performed such that the laser diode threshold current is traversed across, causing relaxation oscillation, and by causing multiple longitudinal modes, the laser light coherence is weakened, as a countermeasure for optical feedback. However, due to giant pulses in relaxation oscillation (see FIG. 13; approximately eight times larger compared with CW), problems of erroneous erasure of data or erroneous writing had remained. And at present, use of modulated frequencies of approximately 300 to 500 MHz in optical disc devices using blue laser diodes is being studied, and when the rotation speed of optical discs has reached its limit for current modulated frequencies, cases are conceivable in which modulated light cannot satisfactorily irradiate the shortest pit lengths formed on optical discs.

However, by means of the optical disc device of the above aspect, by raising the modulating frequency to the relaxation oscillation range, relaxation oscillation in the laser diode is induced even for a modulated amplitude not traversing across the threshold current, and as a result laser coherence is weakened and optical feedback noise can be remedied. Also, by means of the optical disc device of the above aspect, because the modulated high frequency current does not traverse across the laser diode threshold current, the occurrence if giant pulses is reduced compared with the prior art. Hence the optical disc device of the above aspect can be used to reduce erroneous erasure and erroneous writing during data reading from an optical disc, as well as to realize higher-speed reading.

When the modulating frequency is made a high frequency such as within the relaxation oscillation range, power consumption increases, the temperature within the pickup rises, and moreover unwanted radiation may occur. However, where increases in power consumption and rises in temperature within the pickup are concerned, by supplying modulating in the relaxation oscillation range, the laser diode itself undergoes resonance, and modulating can be applied at low power. And with respect to unwanted radiation, if the modulated frequency is spread spectrum, EMI (Electromagnetic Interference) can be reduced.

The above-described aspect is one example of the invention, and of course the invention is in no way limited by the above explanation. This invention comprises all optical disc devices, in which a laser diode is driven by a high frequency modulation method, and in which optical feedback is returned to the laser diode at a timing at which the phase of the injected carrier density is within one of the following ranges: (1) equal to or greater than the peak phase of the injected carrier density of the laser diode, and equal to or less than the peak phase of the injected carrier density of the laser diode plus $3\pi/8$ (radians); or (2) equal to or greater than the peak phase of the injected carrier density of the laser diode plus $9\pi/8$ (radians), and equal to or less than the peak phase of the injected carrier density of the laser diode plus $2\pi$ (radians).

It is preferable that optical feedback be returned to the laser diode at a timing at which the injected carrier density is within one of the following ranges:

(1) equal to or greater than the peak phase of the injected carrier density of the laser diode, and equal to or less than the peak phase of the injected carrier density of the laser diode plus $2\pi/8$ (radians); or, (2) equal to or greater than the peak phase of the injected carrier density of the laser diode plus $10\pi/8$ (radians), and equal to or less than the peak phase of the injected carrier density of the laser diode plus $2\pi$ (radians).

It is still more preferable that optical feedback be returned to the laser diode at a timing at which the injected carrier density is within one of the following ranges:

(1) equal to or greater than the peak phase of the injected carrier density of the laser diode, and equal to or less than the peak phase of the injected carrier density of the laser diode plus $\pi/8$ (radians); or, (2) equal to or greater than the peak phase of the injected carrier density of the laser diode plus $11\pi/8$ (radians), and equal to or less than the peak phase of the injected carrier density of the laser diode plus $2\pi$ (radians).

EMBODIMENT 1

In cases where the modulating frequency is fixed, the optical path lengths (one way) which are the "OK" range in FIG. 2 are calculated using the following equation. However, in order to simplify the explanation, the refractive index N in the optical path from the laser diode to the optical disc is assumed to be "1".

$$L = \tfrac{1}{2} \times \alpha/16 \times C \times 1/f \quad [\text{E4}]$$

where $5+16n \leq \alpha \leq 15+16n$, $n \geq 0$, L is the optical path length (one way), C is the speed of light, and f is the modulating frequency.

To take a specific example:
(1) when the modulating frequency f=800 MHz and n=0, 58,594 mm $\leq$ optical path length (one way) L $\leq$ 175.781 mm;

(2) when the modulating frequency f=1 GHz and n=0, 46,875 mm $\leq$ optical path length (one way) L $\leq$ 140.625 mm; and, (3) when the modulating frequency f=1.2 GHz and n=0, 39,063 mm $\leq$ optical path length (one way) L $\leq$ 117.188 mm.

EMBODIMENT 2

When the optical path length (one way) is fixed, the modulating frequencies which are in the "OK" range in FIG. 2 are calculated using the following equation. However, in order to simplify the explanation, the refractive index N in the optical path from the laser diode to the optical disc is assumed to be "1".

$$f = \tfrac{1}{2} \times \alpha/16 \times C \times 1/L \quad [\text{E5}]$$

where $5+16n \leq \alpha \leq 15+16n$, $n \geq 0$, f is the modulating frequency, C is the speed of light, and L is the optical path length (one way).

To take a specific example:
(1) when the optical path length (one way) L=40 mm and n=0, 1171.875 MHz $\leq$ f $\leq$ 3515.625 MHz;

(2) when the optical path length (one way) L=60 mm and n=0, 781.25 MHz $\leq$ f $\leq$ 2343.75 MHz; and, (3) when the optical path length (one way) L=80 mm and n=0, 585.938 MHz $\leq$ f $\leq$ 1757.813 MHz.

INDUSTRIAL APPLICABILITY

This invention can be utilized in all optical devices, optical disc devices, and light-emitting devices using optical fibers, and in addition can for example be utilized in laser displays and similar. When using this invention in laser displays and similar, laser light coherence can be suppressed, and speckle noise can be reduced.

The invention claimed is:

1. An optical device, in which a laser diode is driven by a high frequency modulation method, wherein in said optical device
    optical feedback is returned to said laser diode at a timing at which a phase of the injected carrier density of said laser diode is within one of the following ranges:
    (1) equal to or greater than the peak phase of the injected carrier density of said laser diode, and equal to or less than the peak phase of the injected carrier density of said laser diode plus $3\pi/8$ (radians); or
    (2) equal to or greater than the peak phase of the injected carrier density of said laser diode plus $9\pi/8$ (radians), and equal to or less than the peak phase of the injected carrier density of said laser diode plus $2\pi$ (radians).

2. An optical device, in which a laser diode is driven by a high frequency modulation method, wherein in said optical device
    an optical path length and a frequency of said high frequency modulation satisfy the following relationship:

$$\sum_i (L_i \times N_i) = 1/2 \times \alpha/16 \times C \times 1/f \quad (6)$$

$$5 + 16n \leq \alpha \leq 15 + 16n, n \geq 0$$

where $L_i$ is the optical path length of an interval, $N_i$ is the refractive index of the interval, C is the speed of light, f is the modulated frequency, and $\Sigma_i L_i$ is the optical path length (one way).

3. An optical device, in which a laser diode is driven by a high frequency modulation method and emits laser light, and a high frequency current for said high frequency modulation does not traverse across a threshold current of said laser diode.

4. The optical device according to claim 1, wherein, by fixing an optical path length and adjusting a frequency of said high frequency modulation, said optical feedback can be returned to said laser diode at said timing.

5. The optical device according to claim 1, wherein, by fixing a frequency of the high frequency modulation and adjusting an optical path length, said optical feedback can be returned to said laser diode at said timing.

6. The optical device according to claim 1, wherein, by simultaneously adjusting a frequency of the high frequency modulation and an optical path length, said optical feedback can be returned to said laser diode at said timing.

7. The optical device according to claim 1, wherein, by adjusting, in alternation, a frequency of the high frequency modulation and an optical path length, said optical feedback can be returned to said laser diode at said timing.

8. The optical device according to claim 1 or claim 2, wherein, during said high frequency modulation, a high frequency current does not traverse across a threshold current of said laser diode.

9. The optical device according to any one of claim 1, claim 2 and claim 3, wherein, in said high frequency modulation, the frequency of high frequency modulation is in a relaxation oscillation range.

10. The optical device according to any one of claim 1, claim 2 and claim 3, wherein said high frequency current of said high frequency modulation is spread spectrum.

11. The optical device according to claim 2, wherein, by fixing said optical path length and adjusting said frequency of the high frequency modulation, an optical feedback can be returned to said laser diode at a timing at which a phase of an injected carrier density of said laser diode is within one of the following ranges:
   (1) equal to or greater than the peak phase of the injected carrier density of said laser diode, and equal to or less than the peak phase of the injected carrier density of said laser diode plus $3\pi/8$ (radians); or
   (2) equal to or greater than the peak phase of the injected carrier density of said laser diode plus $9\pi/8$ (radians), and equal to or less than the peak phase of the injected carrier density of said laser diode plus $2\pi$ (radians).

12. The optical device according to claim 2, wherein, by fixing the frequency of the high frequency modulation and adjusting the optical path length, an optical feedback can be returned to said laser diode at a timing at which a phase of an injected carrier density of said laser diode is within one of the following ranges:
   (1) equal to or greater than the peak phase of the injected carrier density of said laser diode, and equal to or less than the peak phase of the injected carrier density of said laser diode plus $3\pi/8$ (radians); or
   (2) equal to or greater than the peak phase of the injected carrier density of said laser diode plus $9\pi/8$ (radians), and equal to or less than the peak phase of the injected carrier density of said laser diode plus $2\pi$ (radians).

13. The optical device according to claim 2, wherein, by simultaneously adjusting the frequency of the high frequency modulation and the optical path length, an optical feedback can be returned to said laser diode at a timing at which a phase of an injected carrier density of said laser diode is within one of the following ranges:
   (1) equal to or greater than the peak phase of the injected carrier density of said laser diode, and equal to or less than the peak phase of the injected carrier density of said laser diode plus $3\pi/8$ (radians); or
   (2) equal to or greater than the peak phase of the injected carrier density of said laser diode plus $9\pi/8$ (radians), and equal to or less than the peak phase of the injected carrier density of said laser diode plus $2\pi$ (radians).

14. The optical device according to claim 2, wherein, by adjusting, in alternation, the frequency of the high frequency modulation and the optical path length, an optical feedback can be returned to said laser diode at a timing at which a phase of an injected carrier density of said laser diode is within one of the following ranges:
   (1) equal to or greater than the peak phase of the injected carrier density of said laser diode, and equal to or less than the peak phase of the injected carrier density of said laser diode plus $3\pi/8$ (radians); or
   (2) equal to or greater than the peak phase of the injected carrier density of said laser diode plus $9\pi/8$ (radians), and equal to or less than the peak phase of the injected carrier density of said laser diode plus $2\pi$ (radians).

* * * * *